(12) United States Patent
Schoenfeld

(10) Patent No.: US 6,885,034 B1
(45) Date of Patent: Apr. 26, 2005

(54) LIGHT EMITTING DIODE HAVING MULTIPLE PITS

(76) Inventor: Winston Vaughan Schoenfeld, 16004 Wilmington Pl., Tampa, FL (US) 33647

( * ) Notice: Subject to any disclaimer, the term of this patent is extended or adjusted under 35 U.S.C. 154(b) by 0 days.

(21) Appl. No.: 10/840,695

(22) Filed: May 6, 2004

Related U.S. Application Data

(60) Provisional application No. 60/469,345, filed on May 9, 2003.

(51) Int. Cl.[7] .................................................. H01L 29/22
(52) U.S. Cl. ............................... 257/98; 257/79; 438/42
(58) Field of Search ............................... 257/98, 99, 79; 438/42, 43

(56) References Cited

U.S. PATENT DOCUMENTS 5,386,139 A * 1/1995 Idei et al. .................... 257/466
5,779,924 A    7/1998 Krames et al.
5,821,571 A * 10/1998 Lebby et al. .................. 257/98
6,410,942 B1   6/2002 Thibeault et al.
6,518,598 B1   2/2003 Chen
6,630,366 B1 * 10/2003 Taniguchi et al. ............ 438/34
6,797,988 B1 * 9/2004 Lin et al. ...................... 257/98

* cited by examiner

Primary Examiner—Sara Crane
(74) Attorney, Agent, or Firm—David Kiewit

(57) ABSTRACT

The light extraction efficiency of a Light Emitting Diode (LED) is improved by providing pits etched into a top, emitting, surface of the LED. The presence of the pits reduces the mean distance to a sidewall in active regions, and creates regions of higher transmission at which a semi-transparent contact is not present. The walls of the pits are preferably coated with a passivating layer, such as silicon dioxide, to reduce surface leakage currents and to improve the operational stability of the device at the expense of a reduction in optical extraction efficiency commonly obtained with encapsulants having a higher index of refraction.

7 Claims, 3 Drawing Sheets

RADIANT FLUX TABLE

| Die Design | Die Size | Peak WL | # Pits | Pit Size | Pit Geometry | Pit Spacing | Grid | Rad Flux (mW) | % Increase Rad Flux | Vr |
|---|---|---|---|---|---|---|---|---|---|---|
| 1 | 400μm | 457nm | 199 | 10μm | Circle | 20μm | Square | 3.66 | 22.50% | -15.96 |
| 2 | 400μm | 458nm | 63 | 20μm | Circle | 35μm | Square | 3.61 | 20.70% | -15.49 |
| 3 | 400μm | 457nm | 7 | 50μm | Circle | 100μm | Square | 3.42 | 14.50% | -14.8 |
| 4 | 400μm | 457nm | 7 | 50μm | Square | 50μm | Square | 3.42 | 14.50% | -15.46 |
| 5 | 400μm | 457nm | 7 | 50μm | Circle | Random | Random | 3.64 | 21.90% | -15.31 |
| 6 | 400μm | 457nm | 7 | 50μm | Square | Random | Random | 3.6 | 20.70% | -15.3 |
| 1 | 400μm | 451nm | 199 | 10μm | Circle | 20μm | Square | 4.16 | 22.70% | -15.46 |
| 2 | 400μm | 451nm | 63 | 20μm | Circle | 35μm | Square | 4.09 | 20.70% | -16.26 |
| 3 | 400μm | 451nm | 7 | 50μm | Circle | 100μm | Square | 3.88 | 19.40% | -15.52 |
| 4 | 400μm | 451nm | 7 | 50μm | Square | 50μm | Square | 3.85 | 18.50% | -15.7 |
| 5 | 400μm | 450nm | 7 | 50μm | Circle | Random | Random | 4.01 | 18.70% | -15.17 |
| 6 | 400μm | 450nm | 7 | 50μm | Square | Random | Random | 4 | 18.50% | -15.84 |
| 1 | 400μm | 534nm | 199 | 10μm | Circle | 20μm | Square | 2.28 | 34% | n/a |
| 2 | 400μm | 532nm | 63 | 20μm | Circle | 35μm | Square | 2.32 | 36% | n/a |
| 5 | 400μm | 531nm | 7 | 50μm | Circle | Random | Random | 2.34 | 37% | n/a |

Note: Emitting area for all configurations is equal to that of standard (prior art) device with a die size of 350 μm x 350 μm.

Fig. 5

LIGHT EMITTING DIODE HAVING MULTIPLE PITS

BACKGROUND OF THE INVENTION

1. Field of the Invention

This invention relates to light emitting diodes and more particularly to device structures for providing enhanced light extraction efficiency, improved thermal management characteristics, and improved service life.

2. Background Information

Light emitting diodes (LEDs) are a well known class of solid state devices for converting electric energy to light and commonly comprise an active layer of semiconductor material sandwiched between two oppositely doped layers. When a bias is applied across the doped layers, holes and electrons are injected into the active layer where they recombine to generate light, which travels in all directions until it either escapes at an exposed surface, or is reabsorbed.

In U.S. Pat. No. 5,779,924 Krames et al. teach the use of surface texturing on an LED to increase light extraction efficiency through a transparent window layer on a top surface of the LED. This surface texturing has a periodicity and depth on the order of a wavelength of the emitted light. Krames et al. do not teach the use of deep pits extending from a transparent window layer down to a depth beneath an optically active layer of the device.

In U.S. Pat. No. 6,410,942, Thibeault et al. teach that an array of individual LEDs on a single chip may provide enhanced light extraction if the distance light travels inside the semiconductor material before reaching a free surface is reduced. This minimizes internal reabsorption of light. Although Thibeault et al. teach the use of a semitransparent conductive contact layer, their teaching does not include a protective passivating layer over their contact layer, which is thus exposed to environmental degradation. Moreover, Thibeault et al specifically teach structures in which a high index of refraction light extracting element is disposed across an emitting junction in an LED structure.

In U.S. Pat. No. 6,518,598, Chen teaches that a spiral pattern can be cut through the active region of a single LED to enhance light extraction. Topologically, Chen's structure is equivalent to a single elongated mesa configured for light escape primarily from the sidewalls of the mesa. Chen does not disclose a plurality of penetrations that extend through the active region of a single LED mesa. Moreover, Chen's spiral designs define a light path, in which the light experiences multiple total internal reflections, extending along the entire length of the spiral. Light trapped in this mode will experience a pathway that is many times the longitudinal dimensions of the chip.

BRIEF SUMMARY OF THE INVENTION

One aspect of the invention is that it provides an array of micro-pits, strategically placed across a single LED die, to increase the extraction efficiency of light generated within the die. The micro-pit regions improve extraction efficiency by reducing the mean distance to a sidewall in active regions, and by creating regions of higher transmission at which the semi-transparent contact is not present.

A preferred embodiment provides an improvement over a conventional LED comprising a plurality of doped semiconductor layers having an active, light-emitting region disposed between two of the doped layers and having a top surface generally covered with a transparent, or semi-transparent conductive layer. In this embodiment, the improvement is characterized by a plurality of small pits cut through the transparent layer, disposed in the top of the LED and extending downwardly therefrom to a point below the active layer. A particular preferred embodiment is further characterized in that the walls of the pits are coated with a passivating layer, which is preferably silicon dioxide, but which comprise any other suitable passivating material, such as silicon nitride.

A preferred embodiment of the invention provides a structure in which optical extraction efficiency is combined with long term operational stability. This structure may comprise a single contiguous passivation layer over the entire top surface of the LED chip. This layer covers the semi-transparent conductive contact, the side of the emitting area, and the bottom of the void regions. Moreover, this layer prevents degradation of the transparent conductive contact. The preferred material for this passivation layer is $SiO_2$. The typical optical index of refraction of this material is 1.45 which is slightly lower than that of commercially used epoxy and silicone encapsulants (n=1.5–1.6), which do not provide effective passivation. The use of a coating having a lower refractive index slightly reduces the extraction angle for light reaching these surfaces, which leads to a lower overall extraction efficiency. This is the price of superior device stability, and directly contradicts the teachings of Thibeault et al.

An additional feature of preferred embodiments of the invention is that they allow for a significantly increased surface area for heat transfer out of the LED. In an operating LED, heat generation occurs primarily at the p-n junction. This requires that the depth of the pit or void regions in the device is deep enough to allow them to extend through the active region. Additionally, these voids should be produced using a process that does not create significant conductive pathways along the etched surfaces. Such pathways would result in an increased leakage current as the etched surface area increases. This would in turn degrade LED performance and also decrease device reliability.

Although it is believed that the foregoing recital of features and advantages may be of use to one who is skilled in the art and who wishes to learn how to practice the invention, it will be recognized that the foregoing recital is not intended to list all of the features and advantages. Moreover, it may be noted that various embodiments of the invention may provide various combinations of the hereinbefore recited features and advantages of the invention, and that less than all of the recited features and advantages may be provided by some embodiments.

BRIEF DESCRIPTION OF THE SEVERAL VIEWS OF THE DRAWING

FIG. 5 is a table showing the radiant flux obtained from LEDs having various compositions and geometrical configurations.

DETAILED DESCRIPTION OF THE INVENTION

Figure 1:
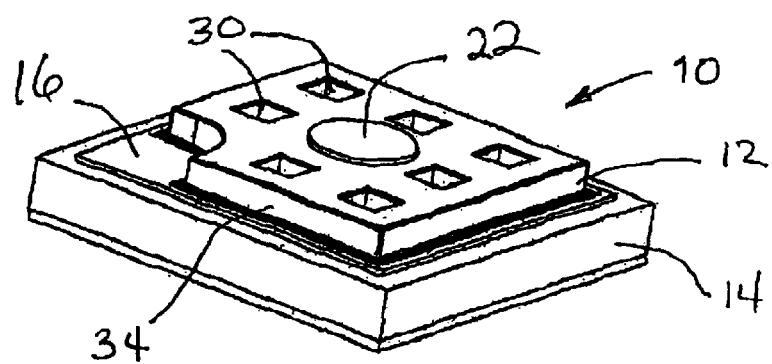
FIG. 1 is a perspective elevational view of a LED die made according to the invention.
Figure 2:
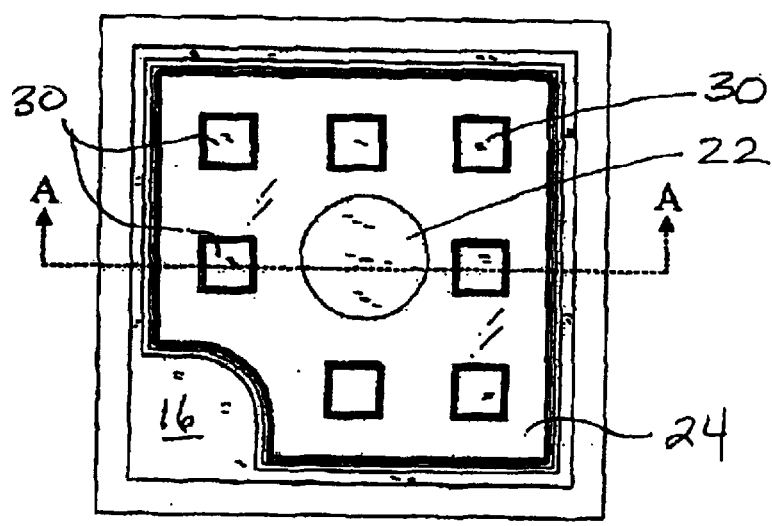
FIG. 2 is a top plan view of the device of FIG. 1.

As is the case with many conventional LEDs, a device of the invention 10 may be formed as a die or mesa 12 extending between two parallel surfaces that, for the purpose of providing the reader with convenient reference to the drawing are referred to as a 'top' and 'bottom', although the reader will recognize that the LED can be operated in any selected orientation and that the words "top" and "bottom" are used throughout this disclosure to refer to the surface having a semitransparent electrode disposed on it and the surface attached to a substrate, respectively. This die is disposed on a suitable substrate 14 that is preferably transparent and has a reflective bottom surface layer 15 disposed on the surface opposite to the substrate surface to which the die 12 is attached. Electrical contact to the bottom of the mesa 12 is made by lower metallic contact 16 disposed on a heavily doped, low resistivity, semiconductor layer 18. A second electrical contact 20 at the top of the mesa 12 may comprise a metallic pad 22 that is in electrical contact with a suitable optically transparent contact layer 24, which is preferably a NiO/Au layer of the sort known in the LED arts.

Figure 3:
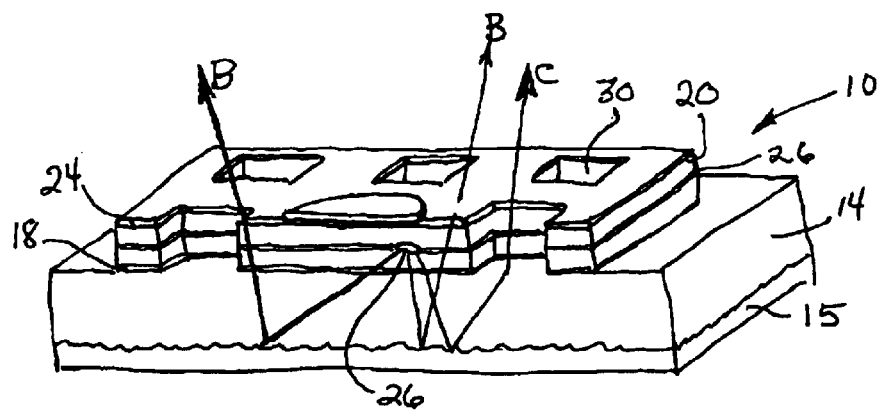
FIG. 3 is a cut-away perspective view, along the section defined by A—A in FIG. 2, schematically depicting operation of an LED device of the invention.

As is known in the LED arts, the device 10 generates light in an active region 26 disposed between two oppositely doped regions 27, 28, each of which is in direct electrical contact with a respective one of the electrodes 16, 20. The light travels in all directions from the active region and either escapes from the device 10 or is parasitically reabsorbed. In a preferred device of the invention 10 some of the light, indicated as rays labeled with the arrows B in FIG. 3, impinges on the transparent contact layer 24 at a sufficiently steep angle of incidence and passes out of the device 10, suffering an intensity loss of some fifteen to twenty percent due to absorption in the less than perfectly transparent contact layer 24. Other fractions of the light, indicated as the ray labeled C in FIG. 3, impinge on one of the walls of a micro-pit 30 at an angle less than the well known critical angle and also pass out of the device 10. Because the transparent contact layer 24 does not extend into the pit 30, absorption losses associated with that layer do not affect light traveling along ray C.

In a conventional LED mesa that does not have an array of micro-pits 30 cut into it, light traveling along the ray C would travel through the device material to the transparent contact layer 24, from which it might be totally internally reflected back into the device. This leads to efficiency losses when the light is re-absorbed by the semiconductor. That is, for some emission directions, the presence of the micro-pit 30 reduces the distance between a point at which light is generated and a free surface through which the light can be usefully emitted. This can increase the net amount of light emitted from an LED having a pre-selected die size.

Increasing the fraction of generated light emitted from the device has an additional advantage of decreasing the amount of heat that would otherwise be generated in the device when the light was parasitically absorbed. As is well known in the LED illumination art, it is necessary to hold the junction temperature within the LED below some maximum value that depends on the choice of semiconductor material being used, but that is normally on the order of one hundred degrees Celsius. This requires conducting heat away from the active region of the LED. Adding micro-pits that extend below the active region of the LED reduces the amount of heat generated per unit device surface area, and thus eases the requirements on heat removal.

Both the size and the placement of micro-pits on an LED have to be selected in order to optimize overall device performance. That is, one has to select geometry intermediate between the two limits of having no pits (i.e., the immediate prior art in LED design) and having a single huge pit that removes the entire active region and yields no functioning device at all. This choice of optimal geometry depends on the materials used in fabricating the LED, which have various values of absorption lengths, optical index of refraction, thermal conductivity, etc. In one particular preferred embodiment an LED designed to provide light at 460 nm is made from $Al_xIn_yGa_{1-x-y}N$ having a die size of 0.4×0.4 mm. An array of 63 pits was provided on this die. Each of the pits had a diameter of twenty microns and the pits were spaced apart in a square grid so that their centers were thirty five microns apart and so that the array generally covered the top of the die, with the exception of the central portion, which is used for an upper metallic contact 20. The pitted die provided a power output of 3.44 mW, which was a 19.1% improvement over what could be obtained from a comparable prior art device that did not have pits.

The use of surface pits to enhance optical output is not restricted to the one preferred embodiment described above. The table that appears as FIG. 5 shows increases in radiant flux obtained from LEDs having three different chemical compositions (and, correspondingly, three different peak emission wavelengths) as well as having a variety of pit array geometries including various numbers of pits of various shapes distributed across respective mesa surfaces in different fashions. In all the cases illustrated in FIG. 5, the mesas were configured as 400×400 $\mu$m dice and the number and sizes of individual pits were selected so as to reduce the total area of the active layer to match that of a prior art LED having a die size of 350×350 $\mu$m. This allowed for a straightforward comparison of the measured optical outputs, which demonstrate an improvement of between 14.5% and 37%.

Figure 4:
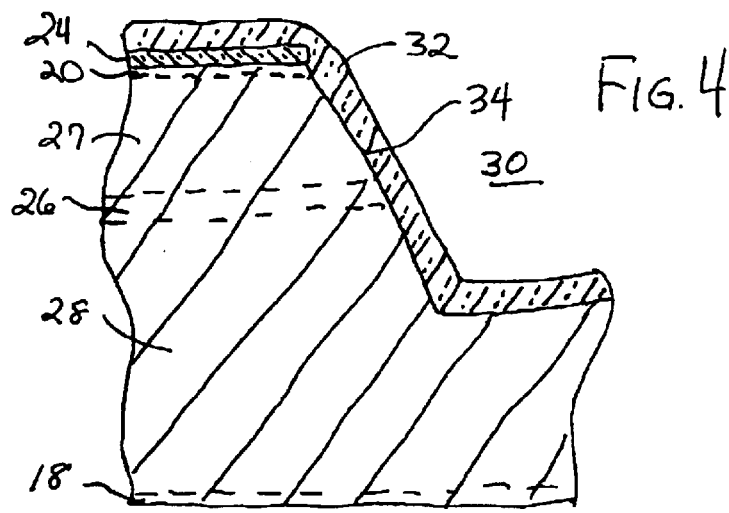
FIG. 4 is a detailed cross sectional view of a portion of one of the pits revealed by cut A—A, where various layers of materials used to make the structure are shown unrealistically thick for the purpose of illustration.

Adding pits to a conventional LED structure, where each of the pits extends through the active region of the LED, increases the total sidewall area of the die. As used herein, a sidewall 34 is an external surface generally transverse to the active region. As is known in the art, a sidewall 34 may be perpendicular to active region, as depicted in FIG. 1, or may be slanted thereto, as shown in FIG. 4. As noted above, this has the beneficial effect of increasing the free surface available for light emission. However, increasing the sidewall area has a potentially detrimental impact if it provides additional conduction paths shunting the active p-n junction—i.e., where the active region 26 encounters a free, or unpassivated surface. This potential problem can be resolved by adding a passivating layer over the sidewalls, and, in particular, over the sidewalls defined by each of the pits.

In a preferred device, a silicon dioxide passivating layer 32 covers the sidewalls of each of the micro-pits 30. This layer provides several benefits. For one thing, it passivates the sidewall and thereby reduces parasitic surface conductance that would otherwise degrade the device's operation. Secondly; it environmentally seals the otherwise exposed edge of the transparent conductive layer 24 at the top surface of the sidewall 34 of the die 12 and thereby provides improved stability.

Those skilled in the LED fabrication arts will recognize that encapsulants, and other materials disposed on the surface of an LED, are commonly selected to have a relatively high index of refraction that comes as close as possible to the index of refraction of the semiconductor body. This approach minimizes total internal reflection at the semiconductor-encapsulant interface and thereby maximizes light extraction. In practice, this leads to the use of encapsulants having indices of refraction that are generally in the range from 1.5 to 1.6. In the presently preferred embodiments, the selection of silicon dioxide, which has a lower value of index of refraction of 1.45, leads to a measurable reduction in optical extraction efficiency, when compared to an encapsulant having an index of 1.5 to 1.6. The higher index encapsulants available for commercial use, however, do not effectively passivate the LED sidewall. Hence, the use of a conventional encapsulant in the preferred pitted structure is accompanied by excessive parasitic surface currents and degradation of the transparent contact layer.

A preferred method of fabrication of an LED structure having an array of micro-pits cut into a top surface thereof departs from a prior art process only in the last few process steps. That is, in either case one prepares a layered semiconductor structure on a suitable substrate and provides a transparent conductive layer 24 on a top surface thereof. In one preferred embodiment, the conductive layer is a known NiO/Au layer. After this layer is deposited, a preferred process of making the micro-pit array comprises the sequentially executed steps of:

a) applying a photoresist layer and photolithographically defining an array of pit locations on the top surface of the LED die;
b) using reactive ion etching to form the array of micro-pits, where each of the pits has a depth (normally 0.5–1.0 microns) adequate to cut through the active region of the device;
c) removing the photoresist;
d) sputter-depositing a passivating layer that is preferably silicon dioxide;
e) photolithographically defining openings in the passivating layer for contact pads and then using an appropriate etchant to remove the exposed portion of the passivating layer;
f) employing conventional deposition and photolithographic etching methods to provide electrical contacts to the top and base of each mesa.

I claim:

1. A light emitting diode comprising:
   a die having parallel top and bottom surfaces and a plurality of sidewalls;
   an active region parallel to the top and bottom surfaces;
   a plurality of pits, each extending from the top surface through the active region so as to define at least a respective sidewall; and
   a passivating layer covering the sidewalls so that no part of the active layer is exposed to a non-passivated surface.

2. The diode of claim 1 further comprising a semi-transparent contact layer disposed on the top surface of the die.

3. The diode of claim 1 wherein the passivating layer comprises sputter-deposited silicon dioxide.

4. The diode of claim 1 wherein the passivating layer has an optical index of refraction that is less than 1.5.

5. A method of making a light emitting diode structure comprising the sequentially executed steps of:
   a) providing a light emitting diode die having parallel top and bottom surfaces, a plurality of sidewalls, a semi-transparent electrode film extending across the top surface, and an active region disposed between and parallel to the top and bottom surfaces;
   b) forming a plurality of pits in the top surface, each of the pits extending from the top surface through the active region, each of the pits comprising at least one respective sidewall;
   c) sputter-depositing a passivating layer to cover the semi-transparent electrode and all the sidewalls;
   e) exposing at least a portion of the semi-transparent electrode; and
   f) depositing a metallic contact on at least a portion of the semitransparent electrode.

6. The process of claim 5 wherein the step of forming the plurality of pits comprises sub-steps of:
   b1) applying a photoresist layer and photolithographically defining a plurality of pit locations; and
   b2) reactive-ion etching into the die at each of the pit locations so as to form the plurality of pits.

7. The process of claim 5 wherein the step of exposing at least a portion of the semitransparent electrode comprises substeps of:
   e1) photolithographically defining openings in the passivating layer; and
   e2) etching away the portions of the passivating layer within the openings.

* * * * *